United States Patent
Wu

(10) Patent No.: US 7,663,391 B2
(45) Date of Patent: Feb. 16, 2010

(54) TEST SYSTEM AND METHOD FOR REDUCING TEST SIGNAL LOSS FOR INTEGRATED CIRCUITS

(75) Inventor: Shun-Ker Wu, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 1 day.

(21) Appl. No.: 12/039,742

(22) Filed: Feb. 29, 2008

(65) Prior Publication Data
US 2009/0102496 A1 Apr. 23, 2009

(30) Foreign Application Priority Data
Oct. 22, 2007 (TW) ............... 96139498 A

(51) Int. Cl.
*G01R 31/26* (2006.01)
(52) U.S. Cl. ................................. 324/765
(58) Field of Classification Search ........... None
See application file for complete search history.

(56) References Cited

U.S. PATENT DOCUMENTS

| 6,937,040 | B2 * | 8/2005 | Maeda et al. | 324/754 |
| 6,954,079 | B2 * | 10/2005 | Sugimoto et al. | 324/763 |
| 2002/0084795 | A1 * | 7/2002 | Cook et al. | 324/754 |
| 2005/0110511 | A1 * | 5/2005 | Gabara et al. | 324/763 |
| 2006/0083861 | A1 * | 4/2006 | Gedeon | 427/402 |
| 2008/0017856 | A1 * | 1/2008 | Fujino | 324/765 |
| 2009/0085596 | A1 * | 4/2009 | Ruf et al. | 324/761 |

* cited by examiner

*Primary Examiner*—Jermele M Hollington
(74) *Attorney, Agent, or Firm*—Winston Hsu

(57) ABSTRACT

An integrated circuit test system includes a probe card, a driver, a receiver, and a first switch. The driver is coupled to the probe card via a first signal line. The receiver is coupled to the probe card via a second signal line. The first switch is coupled between the probe card and the first signal line. After the driver outputs a test signal to a device under test via the first signal line, the first switch is turned off, and then the receiver reads the test signal via the second signal line. Thus, the test signal loss can be reduced.

8 Claims, 6 Drawing Sheets

TEST SYSTEM AND METHOD FOR REDUCING TEST SIGNAL LOSS FOR INTEGRATED CIRCUITS

BACKGROUND OF THE INVENTION

1. Field of the Invention

The present invention relates to a test system of integrated circuits, and more particularly, to a test system of integrated circuits for reducing test signal loss.

2. Description of the Prior Art

Semiconductor devices and integrated circuits require a lot of tests during various manufacture procedures. Since current integrated circuits can process high-speed signals, the high-speed test is required so as to increase the difficulty performance in testing. When the integrated circuits are tested, signal loss and delay would exist between the transmission lines and interfaces of the integrated circuits. Thus, the test system has to separate the signal of the driver from the signal of the receiver. This test system is called "Fly-by".

Please refer to FIG. 1. FIG. 1 is a schematic view of a test system according to the prior art. The test system comprises a tester 10, a first signal line 12, a second signal line 14, a probe card 16 as a testing medium and a device under test (DUT) 19. The tester 10 has a driver 21 and a receiver 29. The driver 21 is coupled to a first contact C1 of the probe card 16 via the first signal line 12. The receiver 29 is coupled to a second contact C2 of the probe card 16 via the second signal line 14. The first contact C1 and the second contact C2 are coupled to the same solder pad B. The solder pad B is electrically connected to a bonding pad A of the DUT 19 via a corresponding needle. The driver can output a test signal. The test signal is transmitted to the solder pad B via the first contact C1, then transmitted to the bonding pad A via the corresponding needle, finally transmitted to the DUT 19 via the bonding pad A. After the DUT 19 responses the test signal, the test signal is transmitted to the receiver 29 via the bonding pad A, solder pad B, and the second contact C2. When the test signal is transmitted from the DUT 19 to the receiver 29, a great signal loss is generated between the solder pad B and the bonding pad A, because the test signal at the solder pad B is influenced by the impedance of the first signal line 12.

Please refer to FIG. 2. FIG. 2 is a schematic circuitry of the test system in FIG. 1. The equivalent circuitry inside the tester 10 (as shown in FIG. 1) comprises the driver 21, a first impedance 22, a first resistor 23, the receiver 29, a second impedance 28 and a second resistor 27. The output voltage of the tester 10 is Vout. One end of the first resistor 23 and one end of the second resistor 27 are coupled to a terminal voltage Vtt. a third impedance 24 and a fourth impedance 26 are the equivalent impedances of the first signal line 12 and the second signal line 14 respectively. The fifth impedance 25 is the equivalent impedance of the needle of the probe card 16. Assume the value of the first impedance 22, the second impedance 28, the third impedance 24, the fourth impedance 26, and the fifth impedance 25 are 50Ω respectively, and the value of the first resistance 23 and the second resistance 27 are 50Ω respectively. When the DUT 19 responses the test signal, for the solder pad B, the equivalent impedance of the first signal line 12 and the equivalent impedance of the second signal line 14 can be regarded as the parallel connection. Thus, the voltage of the solder pad B is equal to the equation:

$$Vb = (Vout - Vtt) \times \frac{(25+25)}{(25+25+50)} = (Vout - Vtt) \times 0.5$$

This shows the signal loss at solder B is 50% more than the output voltage.

In conclusion, when the test system performs the high-speed test, the signal of the driver should be separated from the signal of the receiver. Thus, the driver transmits the test signal to the DUT via the first signal line, and then the test signal is transmitted to the receiver from the DUT via the second signal line. However, the test signal from the DUT is influenced by the impedance of the first signal line seriously so as to result in the signal loss. The large signal loss may fail to read the information of the signal correctly.

SUMMARY OF THE INVENTION

According to an embodiment of the present invention, a test system capable of reducing test signal loss for integrated circuits, comprising: a testing medium; a tester comprising a driver and a receiver, wherein the driver coupled to the testing medium via a first signal line for outputting a test signal and the receiver coupled to the testing medium via a second signal line for reading the test signal; and a first switch coupled between the testing medium and the first signal line such that the first switch is on when the driver is outputting the test signal and off when the receiver is reading the test signal.

According to another embodiment of the present invention, a method for reducing test signal loss for integrated circuits, comprising: transmitting a test signal to a device under test (DUT) via a first current path; turning off the first current path; and transmitting a signal responsive to the test signal from the device under test via a second current path which is independent from the first current path.

According to another embodiment of the present invention, a method for reducing the test signal loss for integrated circuits, comprising: electrically connecting a device under test (DUT) via a probe card; outputting a test signal from a driver to the device under test via a first current path; turning off the first current path via a first switch; and reading a signal responsive to the test signal from the device under test via a second current path, by a receiver.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
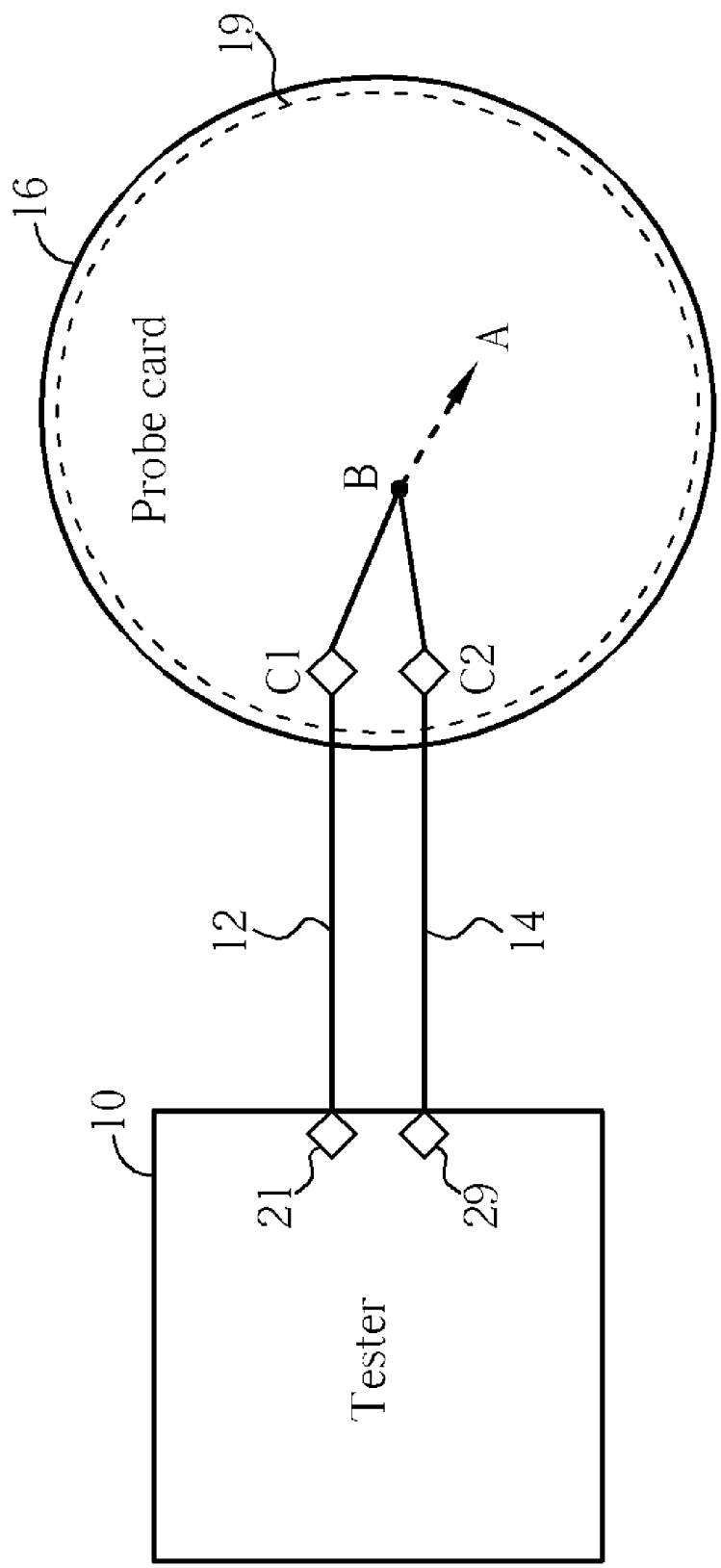
FIG. 1 is a schematic view of a test system according to the prior art.
Figure 2:
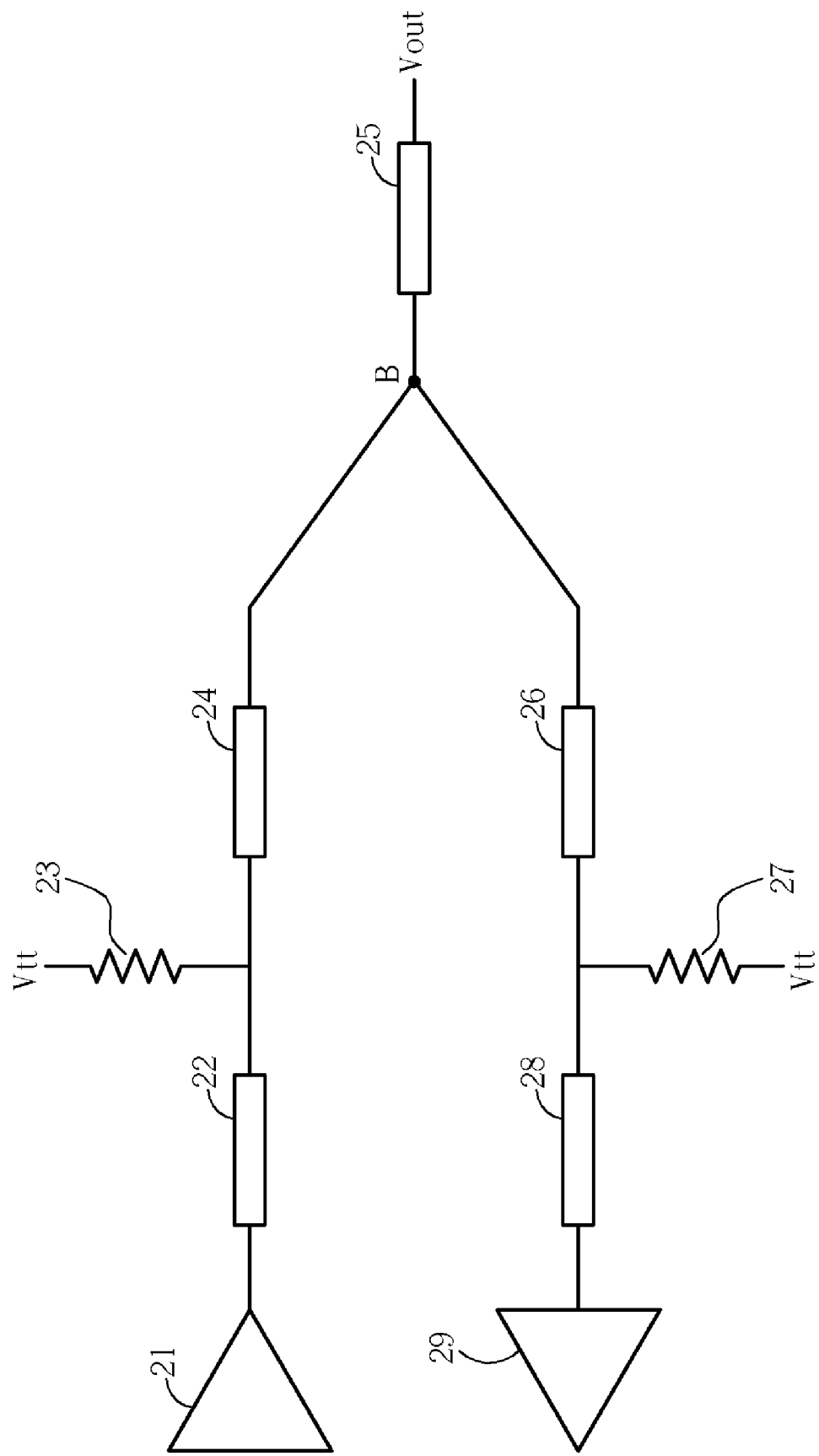
FIG. 2 is a schematic circuitry of the test system in FIG. 1.
Figure 3:
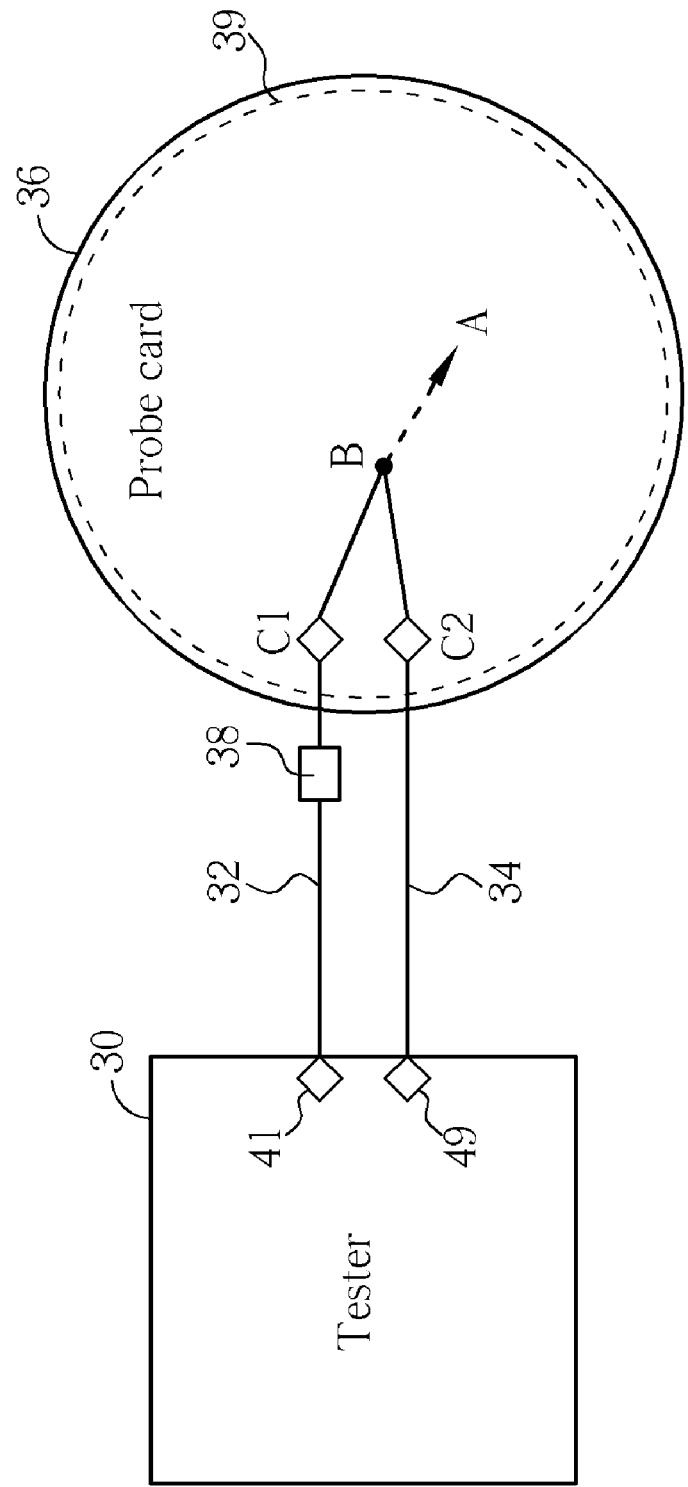
FIG. 3 is a schematic view of a test system according to the present invention.

Please refer to FIG. 3. FIG. 3 is a view of a test system in one embodiment according to the present invention. The test system comprises a tester 30, a first signal line 32, a second signal line 34, a probe card 36, a first switch 38, and a device under test (DUT) 39. The tester 30 has driver 41 and a receiver 49. The driver 41 is coupled to a first contact C1 of the probe card 36 via the first signal line 32. The receiver 49 is coupled to a second contact C2 of the probe card 36 via the second signal line 34. The first contact C1 and the second contact C2 are coupled to the same solder pad B. The solder pad B is electrically connected to a bonding pad A of the DUT 39 via a corresponding needle. According to the present invention, the first switch 38 is coupled between the current path of the driver 41 and the DUT 39. In this embodiment, the first switch 38 is coupled between the first contact C1 and the solder pad B. However, the first switch 38 can be coupled between the first signal line 32 and the first contact C1. The driver 41 can output a test signal, when the first switch 38 is turned on. The test signal is transmitted to the solder pad B via the first contact C1, then is transmitted to the bonding pad A via the corresponding needle, finally is transmitted to the DUT 39 via the bonding pad A. After the DUT 39 responds the test signal, a signal responsive to the test signal is transmitted to the receiver 49 via the bonding pad A, solder pad B, and the second contact C2. When the signal responsive to the test signal is transmitted from the DUT 39 to the receiver 49, a great signal loss is generated between the solder pad B and the bonding pad A, because the test signal at the solder pad B is influenced by the impedance of the first signal line 32. According to the present invention, when the receiver reads the signal from the DUT, the first switch 38 is turned off. The current path between the driver 41 and the DUT 39 becomes an open circuit, so the impedance of the first signal line 32 cannot influence the signal. Thus, the signal loss can be reduced.

Figure 4:
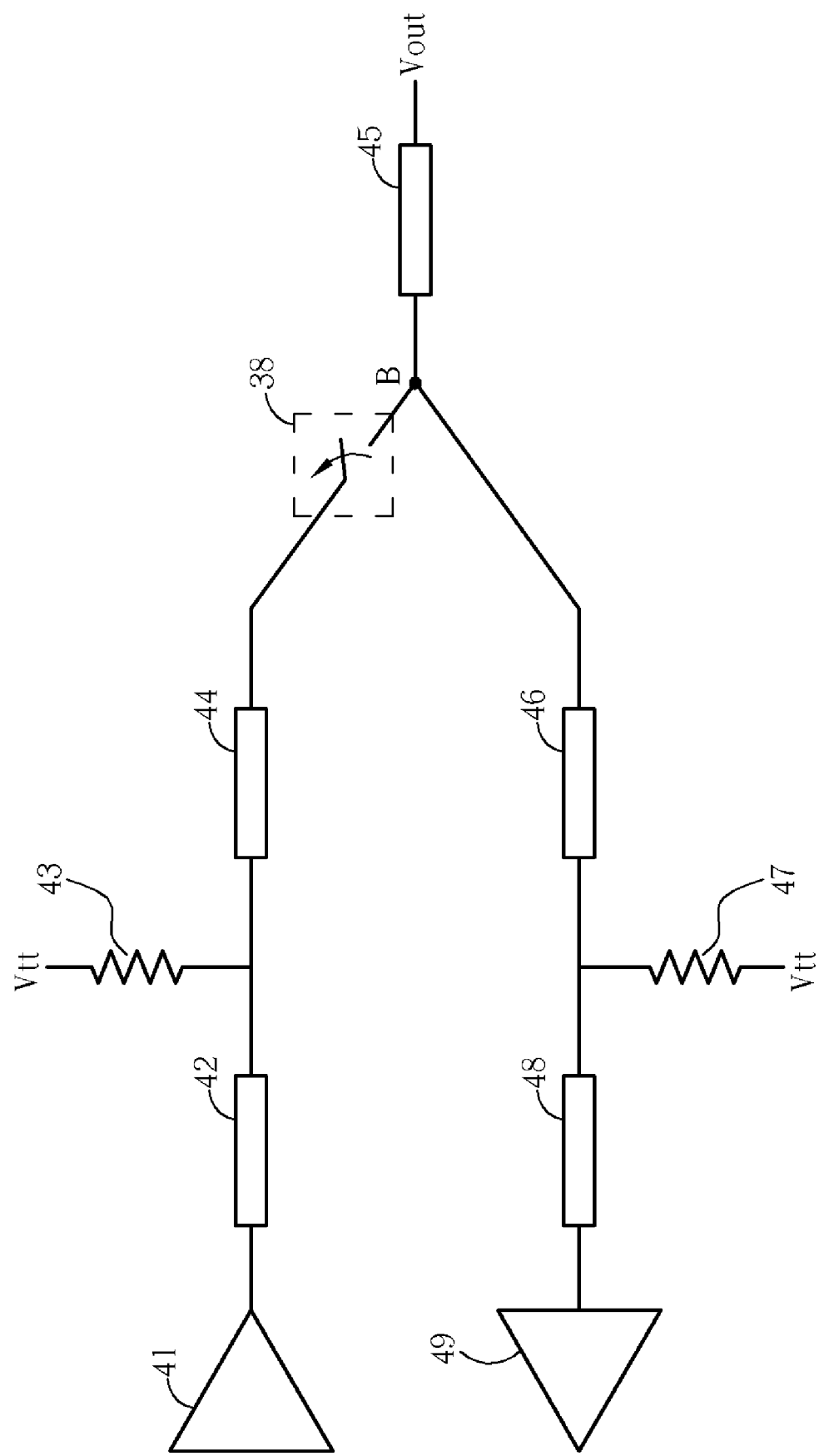
FIG. 4 is a schematic circuitry of the test system in FIG. 3.

Please refer to FIG. 4. FIG. 4 is a schematic circuitry of the test system in FIG. 3. The equivalent circuitry inside the tester 30 comprises the driver 41, the first impedance 42, the first resistor 43, the receiver 49, the second impedance 48 and the second resistor 47. The output voltage of the tester 30 is Vout. One end of the first resistor 43 and one end of the second resistor 47 are coupled to a terminal voltage Vtt. The third impedance 44 and the fourth impedance 46 are the equivalent impedances of the first signal line 32 and the second signal line 34 respectively. The fifth impedance 45 is the equivalent impedance of the needle of the probe card 36. Assume the value of the first impedance 42, the second impedance 48, the third impedance 44, the fourth impedance 46, and the fifth impedance 45 are 50Ω respectively, and the value of the first resistance 43 and the second resistance 47 are 50Ω respectively. The signal loss for the test signal at the solder pad B, in which when the first switch 38 is turned on and turned off, is compared as follows.

When the first switch 38 is turned on, for the solder pad B, the equivalent impedance of the first signal line 32 and the equivalent impedance of the second signal line 34 can be regarded as the parallel connection. Thus, the voltage of the solder pad B:

$$Vb = (Vout - Vtt) \times \frac{(25 + 25)}{(25 + 25 + 50)} = (Vout - Vtt) \times 0.5 \quad \text{Formula (1)}$$

When the first switch 38 is turned off, the first signal line is open, so the voltage of the solder pad B:

$$Vb = (Vout - Vtt) \times \frac{(50 + 50)}{(50 + 50 + 50)} = (Vout - Vtt) \times 0.75 \quad \text{Formula (2)}$$

From Formula (1) and the Formula (2), when the first switch 38 is turned off, the 25% voltage of the solder pad B is increased; that is, the 25% signal loss is reduced. Thus, the first switch 38 is turned on when the driver 41 outputs the test signal and turned off when the receiver 49 reads the signal, so that the signal loss can be reduced.

Figure 5:
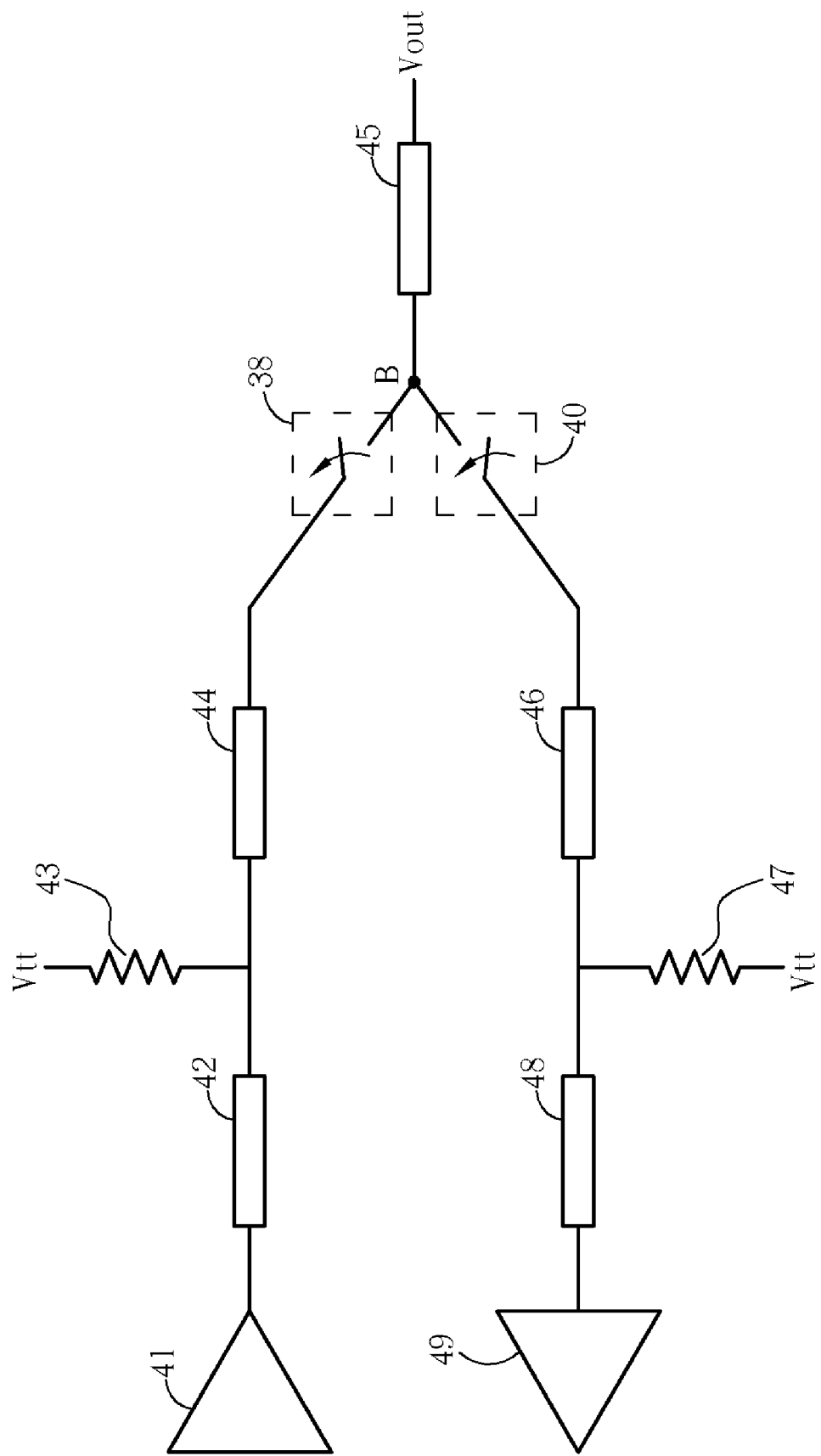
FIG. 5 is a schematic circuitry of another embodiment of a test system according to the present invention.
Figure 6:
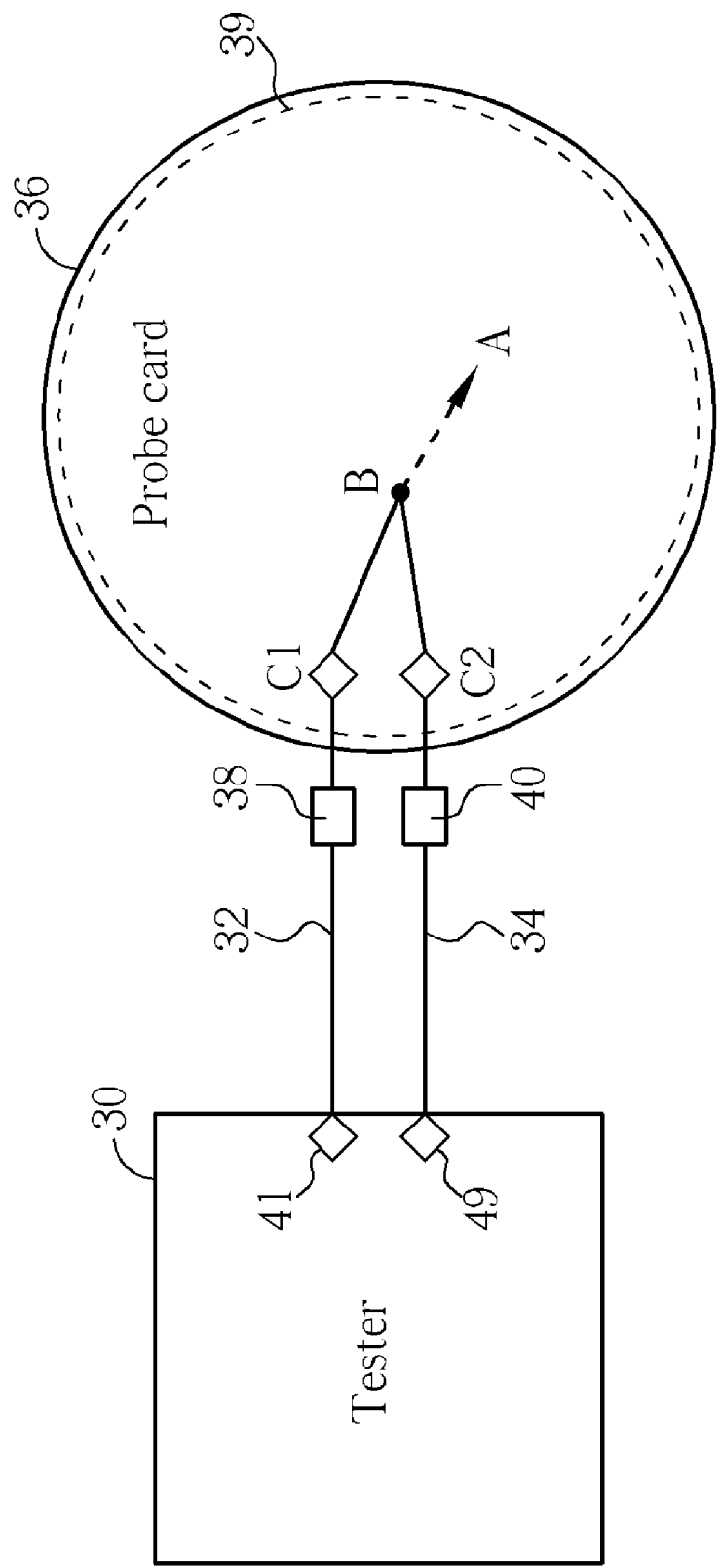
FIG. 6 is a view of the test system according to the schematic circuitry of FIG. 5 of the present invention.

Please refer to FIG. 5. FIG. 5 is a schematic circuitry of another embodiment of a test system according to the present invention. In this embodiment, the test system comprises a second switch 40 additional. The first switch 38 is coupled between a first current path of the driver 41 and the solder pad B. The second switch 40 is coupled between a second current path of the receiver 49 and the solder pad B. For instances, please refer to FIG. 6, FIG. 6 is a view of the test system according to the schematic circuitry of FIG. 5 of the present invention. The operation of the second switch 40 and the first switch 38 is complementary, for example, when the first switch 38 is turned on, the second switch 40 is turned off; when the first switch 38 is turned off, the second switch 40 is turned on. Thus, when the driver 41 outputs a test signal, the first switch 38 is turned on and the second switch 40 is turned off, so the test signal is transmitted to the solder pad B via the first current path. When the receiver 49 reads the signal, the second switch 40 is turned on and the first switch 38 is turned off, so the signal is transmitted from the solder pad B to the receiver 49 via the second current path. When the test system performs the high-speed test, the test system outputs the test signal via the first current path and receives the signal via the second current path. However, when the receiver 49 reads the signal from DUT, the signal is influenced by the impedance of the first current path so as to result in a great signal loss. In this embodiment, utilizing the complementary operation of the first switch 38 and the second switch 40, when the first current path is turned on, the second current path is turned off; when the first current path is turned off, the second current path is turned on, so the current paths for outputting and receiving the signals are not influenced by each other. Thus, the signal loss can be reduced. In addition, since the test system performs the high-speed test, the first switch 38 and the second switch 40 are RF switches.

In conclusion, the present invention provides the test system and the method for reducing the signal loss for integrated circuits. When the test system performs the high-speed test, the test system outputs the test signal to the DUT via the first signal line and receives the signal via the second signal line. However, when the receiver reads the test signal from DUT, the test signal is influenced by the impedance of the first signal line so as to result in a great signal loss. Thus, the test system according to the present invention comprises a probe card, a driver, a receiver, and a first switch. The driver is coupled to the probe card via a first signal line. The receiver is coupled to the probe card via a second signal line. The probe card is electrically connected to a DUT. The first switch is coupled between the probe card and the first signal line. The method according to the present invention comprises the driver outputting the test signal to the DUT via the first signal line, turning off the first switch, and the receiver reading the test signal via the second signal line. Thus, the test signal loss can be reduced.

Those skilled in the art will readily observe that numerous modifications and alterations of the device and method may be made while retaining the teachings of the invention.

What is claimed is:

1. A test system capable of reducing test signal loss for integrated circuits, comprising:
    a testing medium;
    a tester comprising a driver and a receiver, wherein the driver coupled to the testing medium via a first signal line for outputting a test signal and the receiver coupled to the testing medium via a second signal line for reading the test signal;
    a first switch coupled between the testing medium and the first signal line such that the first switch is on when the driver is outputting the test signal and off when the receiver is reading the test signal; and
    a second switch coupled between the testing medium and the second signal line such that the second switch is off when the driver is outputting the test signal and on when the receiver is reading the test signal.

2. The test system of claim 1, wherein the driver has an output end adapted to couple to a terminal voltage, and the receiver has an input end adapted to couple to the terminal voltage.

3. The test system of claim 1, wherein the testing medium comprises a first contact, a second contact, and a solder pad, the first signal line coupled to the first contact, the second signal line coupled to the second contact, the first contact and the second contact coupled to the solder pad, and the first switch coupled between the first signal line and the solder pad, and the second switch coupled between the second signal line and the solder pad.

4. The test system of claim 1, wherein the testing medium is a probe card.

5. A method for reducing the test signal loss for integrated circuits, comprising:
    electrically connecting a device under test (DUT) via a probe card;
    activating a first current path by turning on a first switch before outputting a test signal from a driver to the device under test;
    deactivating a second current path by turning off a second switch when the first switch is turned on;
    outputting a test signal from the driver to the device under test via the first current path;
    deactivating the first current path by turning off the first switch before reading a signal responsive to the test signal from the device under test;
    activating the second current path by turning on the second switch when the first switch is turned off; and
    reading a signal responsive to the test signal from the device under test via a second current path, by a receiver.

6. The method of claim 5, wherein the step of deactivating the first current path is utilizing the first switch to deactivating the first current path before the receiver reads the test signal via the second current path.

7. A test system for performing the method of claim 5, comprising:
    the probe card being electrically connecting the device under test;
    the driver coupled to the probe card via a first signal line;
    the receiver coupled to the probe card via a second signal line; and
    the first switch being connected between the probe card and the first signal line.

8. The test system of claim 7, further comprising a second switch coupled between the probe card and the second signal line.

* * * * *